US012349372B2

(12) United States Patent
Liu

(10) Patent No.: US 12,349,372 B2
(45) Date of Patent: Jul. 1, 2025

(54) METHOD OF FORMING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 397 days.

(21) Appl. No.: 18/149,182

(22) Filed: Jan. 3, 2023

(65) Prior Publication Data

US 2023/0141481 A1 May 11, 2023

Related U.S. Application Data

(63) Continuation of application No. PCT/CN2021/135640, filed on Dec. 6, 2021.

(30) Foreign Application Priority Data

Sep. 10, 2021 (CN) .......................... 202111060919.6

(51) Int. Cl.
H01L 21/768 (2006.01)
H01L 23/48 (2006.01)
(Continued)

(52) U.S. Cl.
CPC ......... *H10D 1/20* (2025.01); *H01L 21/76898* (2013.01); *H01L 23/481* (2013.01); *H01L 23/5227* (2013.01)

(58) Field of Classification Search
CPC ............. H01L 21/76898; H01L 21/768; H01L 23/481; H01L 23/48; H01L 23/5227; H01L 23/522; H10D 1/20
See application file for complete search history.

(56) References Cited

U.S. PATENT DOCUMENTS 6,830,970 B2 12/2004 Gardes
2003/0068884 A1* 4/2003 Gardes .................. H01L 23/481
257/E21.597
(Continued)

FOREIGN PATENT DOCUMENTS

CN 1420716 A 5/2003
CN 106653728 A 5/2017
(Continued)

OTHER PUBLICATIONS

International Search Report cited in PCT/CN2021/135640 mailed Mar. 17, 2022, 8 pages.
(Continued)

*Primary Examiner* — Omar F Mojaddedi
(74) *Attorney, Agent, or Firm* — Kilpatrick Townsend & Stockton LLP

(57) ABSTRACT

The present disclosure provides a method of forming a semiconductor structure and a semiconductor structure. The method of forming the semiconductor structure includes: providing an initial structure, where the initial structure includes a substrate and a dielectric layer; forming a conductive trench, where a distance between a bottom surface of the conductive trench and a second side surface of the substrate is a first spacing; forming a conductive hole, where the conductive hole extends to the second side surface of the substrate from a top surface of the dielectric layer; forming a conductive pillar, where the conductive pillar fills the conductive hole; forming an inductor structure, where the inductor structure fills the conductive trench, and projection of the inductor structure on the substrate is provided as a spiral structure that uses projection of the conductive pillar on the substrate as an inductor center and that surrounds the inductor center.

16 Claims, 12 Drawing Sheets

(51) Int. Cl.
    *H01L 23/522*    (2006.01)
    *H10D 1/20*      (2025.01)

(56) References Cited

U.S. PATENT DOCUMENTS

| | | | | |
|---|---|---|---|---|
| 2011/0073987 | A1* | 3/2011 | Mackh | H01L 23/481 |
| | | | | 257/E29.166 |
| 2011/0227689 | A1* | 9/2011 | Chang | H01L 23/5227 |
| | | | | 336/200 |
| 2015/0200050 | A1* | 7/2015 | Nakao | H01F 17/04 |
| | | | | 336/200 |
| 2015/0255529 | A1* | 9/2015 | Wang | H01L 21/31111 |
| | | | | 438/3 |
| 2019/0279806 | A1* | 9/2019 | Darmawikarta | H01F 27/2804 |

FOREIGN PATENT DOCUMENTS

| | | | |
|---|---|---|---|
| CN | 111755204 | A | 10/2020 |
| CN | 111952194 | A | 11/2020 |
| CN | 112151496 | A | 12/2020 |

OTHER PUBLICATIONS

The First Office Action issued in Chinese corresponding application No. 202111060919.6 mailed on May 16, 2025, 13 pages.

* cited by examiner

METHOD OF FORMING SEMICONDUCTOR STRUCTURE AND SEMICONDUCTOR STRUCTURE

CROSS-REFERENCE TO RELATED APPLICATIONS

This is a continuation of International Application No. PCT/CN2021/135640, filed on Dec. 6, 2021, which claims the priority to Chinese Patent Application No. 202111060919.6, titled "METHOD OF FORMING SEMICONDUCTOR STRUCTURE AND SEMICONDUCTOR STRUCTURE" and filed on Sep. 10, 2021. The entire contents of International Application No. PCT/CN2021/135640 and Chinese Patent Application No. 202111060919.6 are incorporated herein by reference.

TECHNICAL FIELD

The present disclosure relates to, but is not limited to, a method of forming a semiconductor structure and a semiconductor structure.

BACKGROUND

An integrated circuit (IC) packaging technology is a technology that a plurality of chips are stacked and interconnected by through silicon vias (TSVs). Vertically interconnected TSV structures are separately formed on the plurality of chips and electrical interconnection between different chips is achieved through a subsequent redistribution layer (RDL).

An existing TSV technology usually integrates integrated passive devices (IPDs) on a semiconductor substrate. In the technology for the IPDs, resistors, capacitors, and inductors in a circuit are integrated into one chip. However, as the IC continues to become more integrated, a size of the IC is reduced, and a characteristic size of the IPD is also reduced. The size reduction of the IPD leads to a decrease in a quality factor of an inductance in the IPD. Consequently, it is difficult for the inductance generated by the IPD to meet an application requirement of the IC.

SUMMARY

An overview of the subject matter detailed in the present disclosure is provided below, which is not intended to limit the protection scope of the claims.

The present disclosure provides a method of forming a semiconductor structure and a semiconductor structure.

A first aspect of the present disclosure provides a method of forming a semiconductor structure. The method of forming a semiconductor structure includes:
  providing an initial structure, where the initial structure includes a substrate and a dielectric layer provided on the substrate, the dielectric layer is provided on a first side of the substrate, and a bottom surface of the dielectric layer is connected to a first side surface of the substrate;
  forming a conductive trench, where the conductive trench extends to a second side surface of the substrate from a top surface of the dielectric layer, the conductive trench exposes part of the dielectric layer and part of the substrate, and a distance between a bottom surface of the conductive trench and the second side surface of the substrate is a first spacing;
  forming a conductive hole, where the conductive hole extends to the second side surface of the substrate from the top surface of the dielectric layer;
  forming a conductive pillar, where the conductive pillar fills the conductive hole;
  forming an inductor structure, where the inductor structure fills the conductive trench, and projection of the inductor structure on the substrate is provided as a spiral structure that uses projection of the conductive pillar on the substrate as an inductor center and that surrounds the inductor center; and
  forming an inductor lead-out structure, where the inductor lead-out structure covers the conductive pillar and the inductor structure that are exposed by the top surface of the dielectric layer.

A second aspect of the present disclosure provides a semiconductor structure, where the semiconductor structure includes:
  a substrate, where the substrate includes a first side and a second side;
  a dielectric layer, where the dielectric layer is provided on the first side of the substrate, and a bottom surface of the dielectric layer is connected to a first side surface of the substrate;
  a conductive trench, where the conductive trench extends to a second side surface of the substrate from a top surface of the dielectric layer, the conductive trench exposes part of the dielectric layer and part of the substrate, and a distance between a bottom surface of the conductive trench and the second side surface of the substrate is a first spacing;
  a conductive hole, where the conductive hole extends to the second side surface of the substrate from the top surface of the dielectric layer;
  a conductive pillar, where the conductive pillar fills the conductive hole;
  an inductor structure, where the inductor structure fills the conductive trench, and projection of the inductor structure on the substrate is provided as a spiral structure that uses projection of the conductive pillar on the substrate as an inductor center and that surrounds the inductor center; and
  an inductor lead-out structure, where the inductor lead-out structure covers the conductive pillar and the inductor structure that are exposed by the top surface of the dielectric layer.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
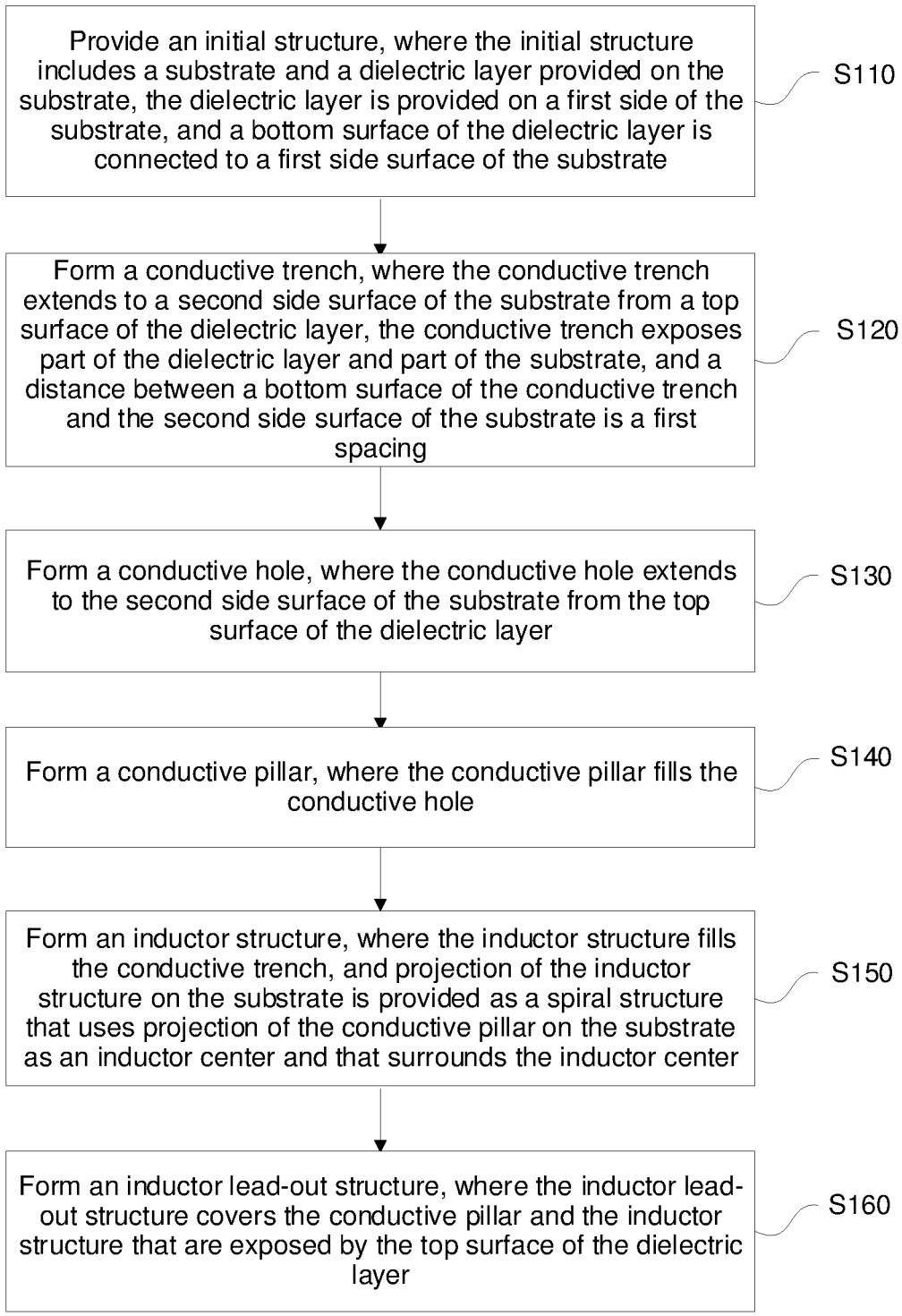
FIG. 1 is a flowchart of a method of forming a semiconductor structure according to an exemplary embodiment.

An exemplary embodiment of the present disclosure provides a method of forming a semiconductor structure, as shown in FIG. 1. FIG. 1 is a flowchart of a method of forming a semiconductor structure according to an exemplary embodiment of the present disclosure. FIG. 5 to FIG. 20 are schematic diagrams of various stages of the method of forming a semiconductor structure. The method of forming a semiconductor structure is described below with reference to FIG. 5 to FIG. 20.

The semiconductor structure is not limited in this embodiment. That the semiconductor structure is a dynamic random access memory (DRAM) is used as an example below for description, but this embodiment is not limited thereto. Alternatively, the semiconductor structure in this embodiment may be other structures.

As shown in FIG. 1, an exemplary embodiment of the present disclosure provides a method of forming a semiconductor structure, including the following steps:

Step S110: Provide an initial structure, where the initial structure includes a substrate and a dielectric layer provided on the substrate, the dielectric layer is provided on a first side of the substrate, and a bottom surface of the dielectric layer is connected to a first side surface of the substrate.

Figure 5:
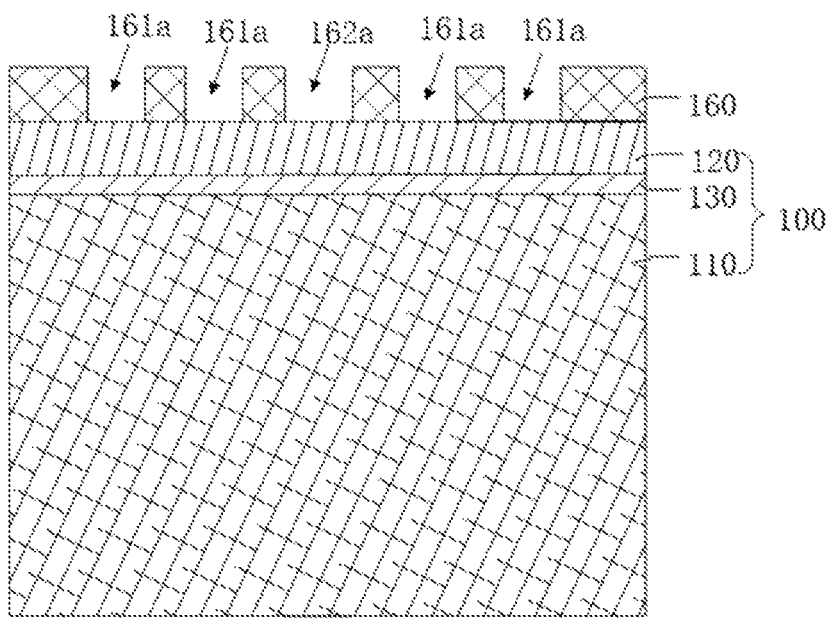
FIG. 5 is a schematic diagram of forming a first mask layer on an initial structure in a method of forming a semiconductor structure according to an exemplary embodiment.

As shown in FIG. 5, the substrate 110 includes a semiconductor material. The semiconductor material may be one or more of silicon, germanium, a silicon-germanium compound, and a silicon-carbon compound. The substrate 110 may be a silicon-on-insulator (SOI) substrate or a germanium-on-insulator (GOI) substrate.

The dielectric layer 120 may include a dielectric material. The dielectric layer 120 may include silicon oxide.

In this embodiment, an isolation layer 130 may further be provided between the substrate 110 and the dielectric layer 120, and the isolation layer 130 is provided to isolate the substrate 110 from being in direct contact with the dielectric layer 120. The isolation layer 130 may include an insulating material. The isolation layer 130 may include insulating materials such as silicon nitride and silicon oxide.

Step S120: Form a conductive trench, where the conductive trench extends to a second side surface of the substrate from a top surface of the dielectric layer, the conductive trench exposes part of the dielectric layer and part of the substrate, and a distance between a bottom surface of the conductive trench and the second side surface of the substrate is a first spacing.

Figure 7:
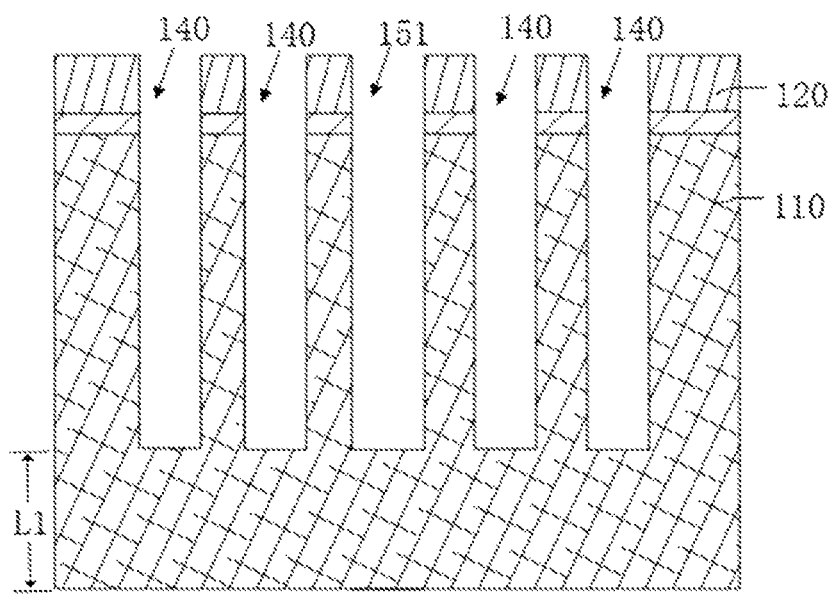
FIG. 7 is a schematic diagram of forming a conductive trench and an initial conductive hole in a method of forming a semiconductor structure according to an exemplary embodiment.

As shown in FIG. 7, referring to FIG. 5, the conductive trench 140 may be formed by removing part of the dielectric layer 120 and part of the substrate 110 through etching by a dry etching or wet etching process. The conductive trench 140 extends to a second side surface of the substrate 110 from a top surface of the dielectric layer 120, and a distance between a bottom surface of the conductive trench 140 and the second side surface of the substrate 110 is a first spacing L1.

The thickness of an initial structure 100 is 3 µm to 10 µm. The thickness of the dielectric layer 120 is 0.05 µm to 0.3 µm. The depth of the conductive trench 140 is 1 µm to 10 µm. The distance between the bottom surface of the conductive trench 140 and the second side surface of the substrate 110 is the first spacing L1 greater than 1 µm.

Step S130: Form a conductive hole, where the conductive hole extends to the second side surface of the substrate from the top surface of the dielectric layer.

Figure 9:
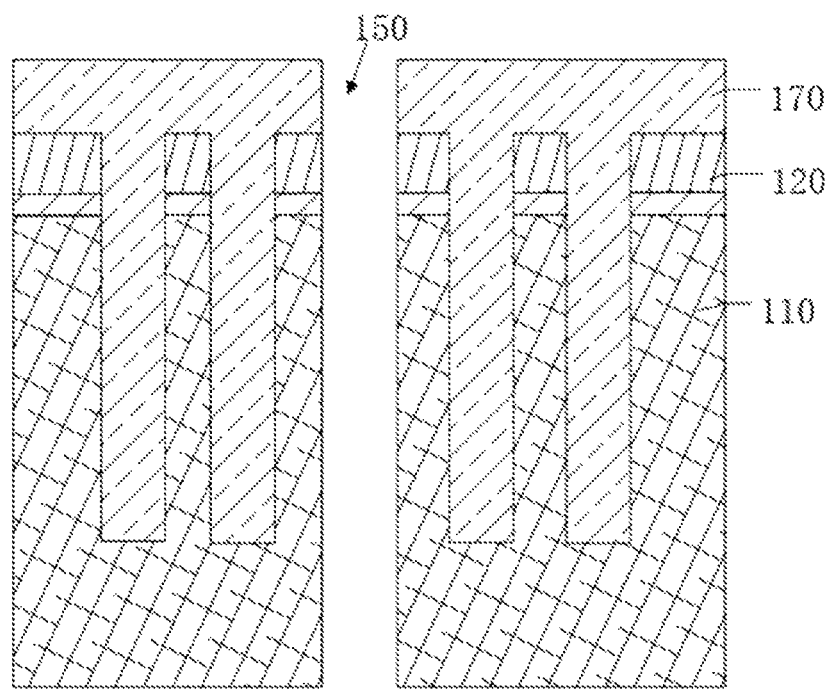
FIG. 9 is a schematic diagram of forming a conductive hole in a method of forming a semiconductor structure according to an exemplary embodiment.

As shown in FIG. 9, referring to FIG. 7, the conductive hole 150 may be formed by removing part of the dielectric layer 120 and part of the substrate 110 through etching, and the conductive hole 150 runs through the initial structure 100. In this embodiment, the conductive hole 150 is provided in the middle of the conductive trench 140 and the conductive hole 150 is surrounded by the conductive trench 140. Projection of the conductive trench 140 formed on the substrate 110 is a spiral pattern that uses projection of the conductive hole 150 formed on the substrate 110 as a center.

Step S140: Form a conductive pillar, where the conductive pillar fills the conductive hole.

Figure 15:
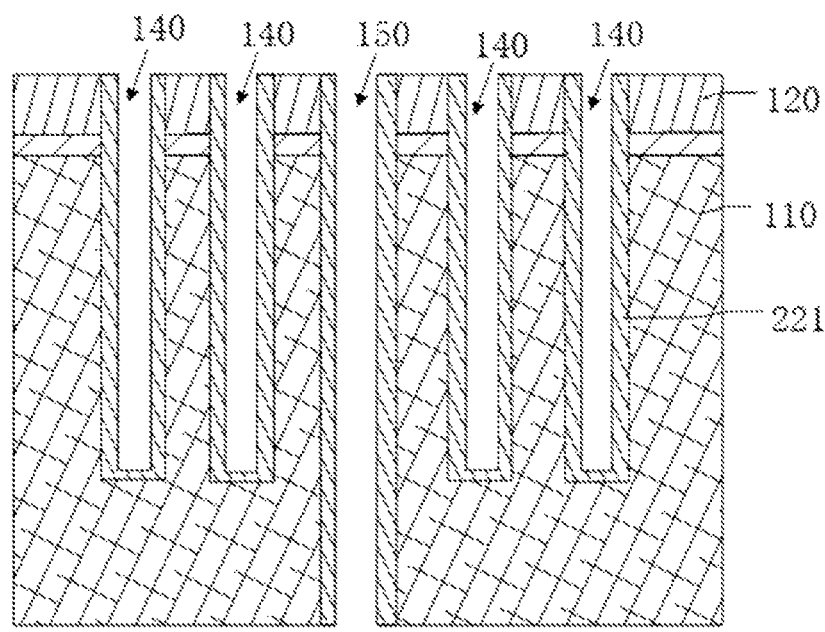
FIG. 15 is a schematic diagram of forming a first barrier layer and a second barrier layer in a method of forming a semiconductor structure according to an exemplary embodiment.
Figure 16:
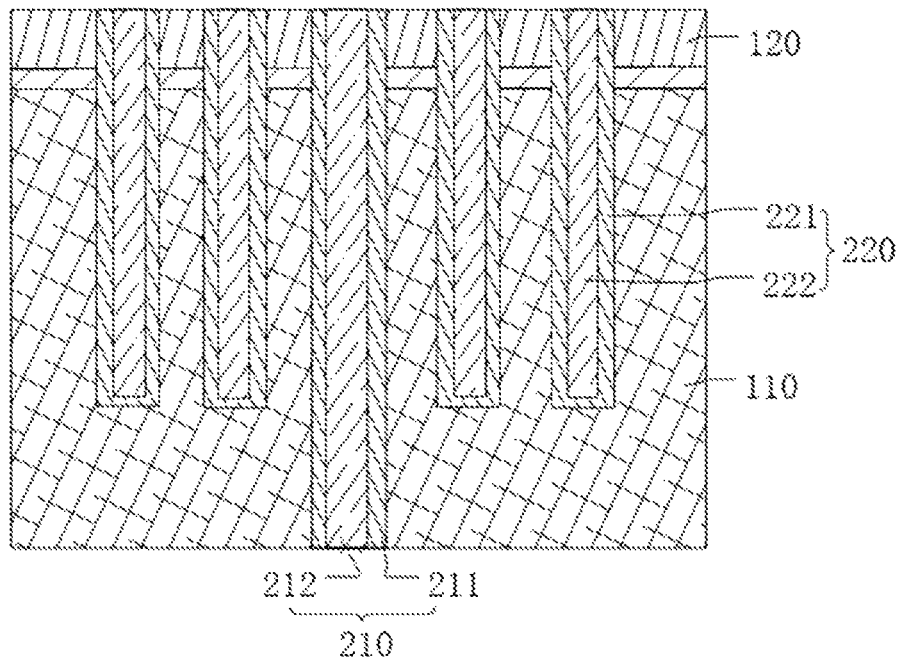
FIG. 16 is a schematic diagram of forming a conductive pillar and an inductor structure in a method of forming a semiconductor structure according to an exemplary embodiment.

Forming a conductive pillar 210 includes: As shown in FIG. 15, referring to FIG. 9, a first barrier layer 211 may be formed by depositing tantalum (Ta) or a tantalum compound by using an atomic layer deposition (ALD) process, where the first barrier layer covers a sidewall of the conductive hole 150. In this embodiment, a material of the first barrier layer 211 is Ta. As shown in FIG. 16, referring to FIG. 15, a conductive metal is deposited by using an electroplating process, a first conductive layer 212 is formed by the conductive metal by filling the conductive hole 150, and the conductive pillar 210 is formed by the first barrier layer 211 and the first conductive layer 212. In this embodiment, the conductive metal may be copper or a copper compound.

Step S150: Form an inductor structure, where the inductor structure fills the conductive trench, and projection of the inductor structure on the substrate is provided as a spiral structure that uses projection of the conductive pillar on the substrate as an inductor center and that surrounds the inductor center.

Figure 17:
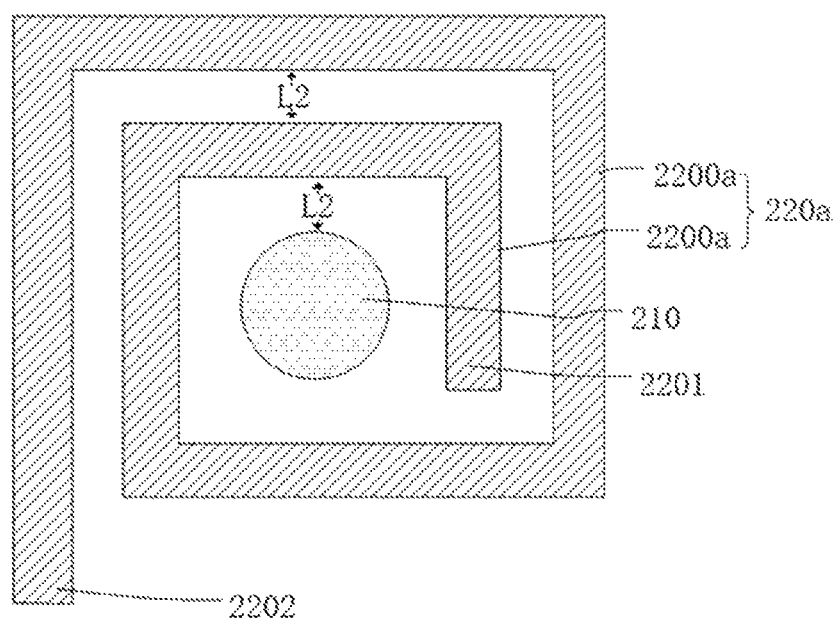
FIG. 17 is a schematic diagram of projection, of a conductive pillar and an inductor structure, formed on a substrate in a method of forming a semiconductor structure according to an exemplary embodiment.

As shown in FIG. 15 and FIG. 16, a process of forming the inductor structure 220 and a process of forming the conductive pillar 210 are approximately the same: forming a second barrier layer 221 covering the conductive trench 140 by depositing Ta or a tantalum compound, and forming a second conductive layer 222 by filling a conductive trench 140 by a conductive metal deposited by using an electroplating process. The second barrier layer 221 and the second conductive layer 222 form the inductor structure 220. In this embodiment, the conductive metal may be copper or a copper compound. As shown in FIG. 17, in this embodiment, projection of the inductor structure 220 on the substrate 110 is provided as a spiral structure 220a that uses projection of the conductive pillar 210 on the substrate 110 as an inductor center and that surrounds the inductor center.

Step S160: Form an inductor lead-out structure, where the inductor lead-out structure covers the conductive pillar and the inductor structure that are exposed by the top surface of the dielectric layer.

Figure 18:
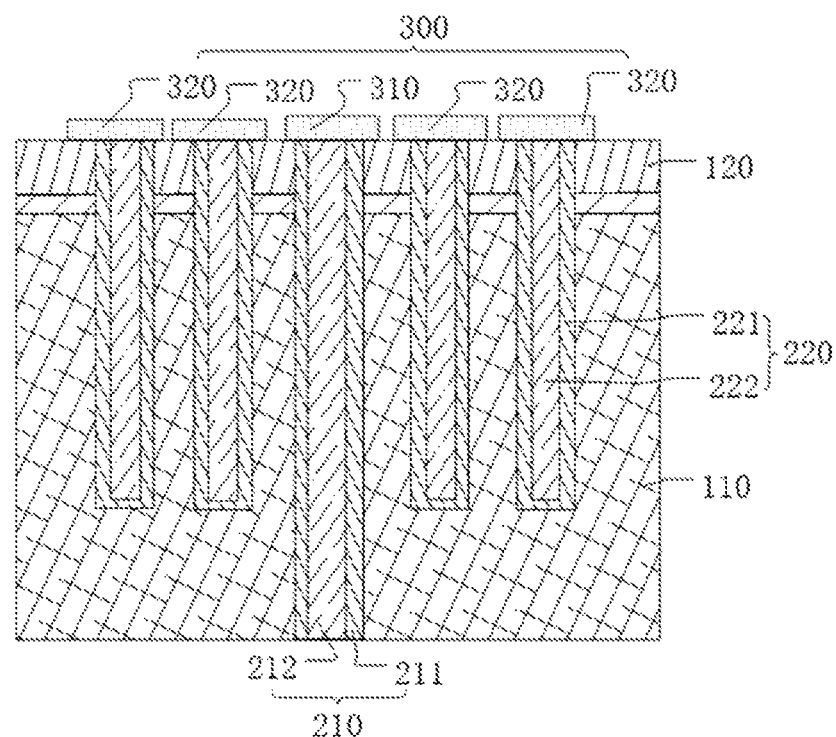
FIG. 18 is a schematic diagram of forming a first metal pad and a second metal pad in a method of forming a semiconductor structure according to an exemplary embodiment.
Figure 19:
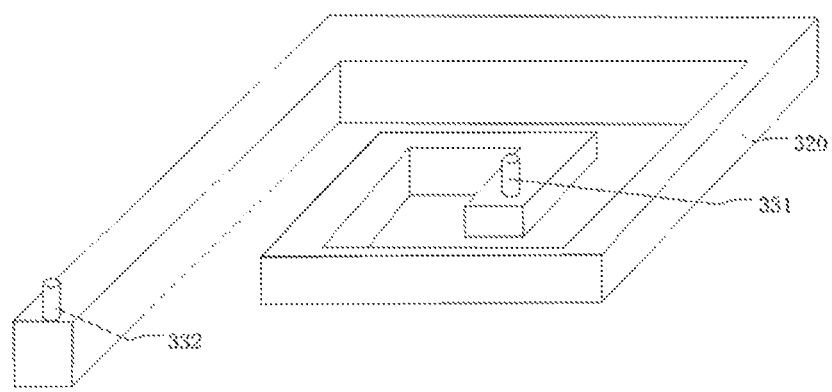
FIG. 19 is a schematic diagram of forming a first inductor lead-out portion and a second inductor lead-out portion in a method of forming a semiconductor structure according to an exemplary embodiment.

Referring to FIG. 18 and FIG. 19, the inductor lead-out structure 300 includes at least a first inductor lead-out portion 331 and a second inductor lead-out portion 332 that are connected to the inductor structure 220, and the inductor structure 220 is connected to an external terminal by using the first inductor lead-out portion 331 and the second inductor lead-out portion 332, such that when a current passes through the conductive pillar 210, the inductor structure 220 is affected by the induced current to produce an inductance.

According to the method of forming a semiconductor structure in this embodiment, the inductor structure surrounding the conductive pillar and the inductor lead-out structure connected to the inductor structure are formed, such that an embedded inductor device with the conductive pillar as a magnetic core and the inductor structure as a winding coil around the conductive pillar is formed in the semiconductor structure. The conductive pillar of the semiconductor structure formed in this embodiment is not only used as an TSV structure used for interconnection, but also used as the magnetic core of the inductor device, such that when the conductive pillar is electrically connected to another interconnection structure, and a current passes through the conductive pillar, the inductor structure induces the current in the conductive pillar to produce an inductance. The semiconductor structure formed in this embodiment can produce an inductance when turned on, to meet the demand for inductance, without integrating passive devices in the semiconductor structure. This can further reduce the size of the semiconductor structure.

Figure 2:
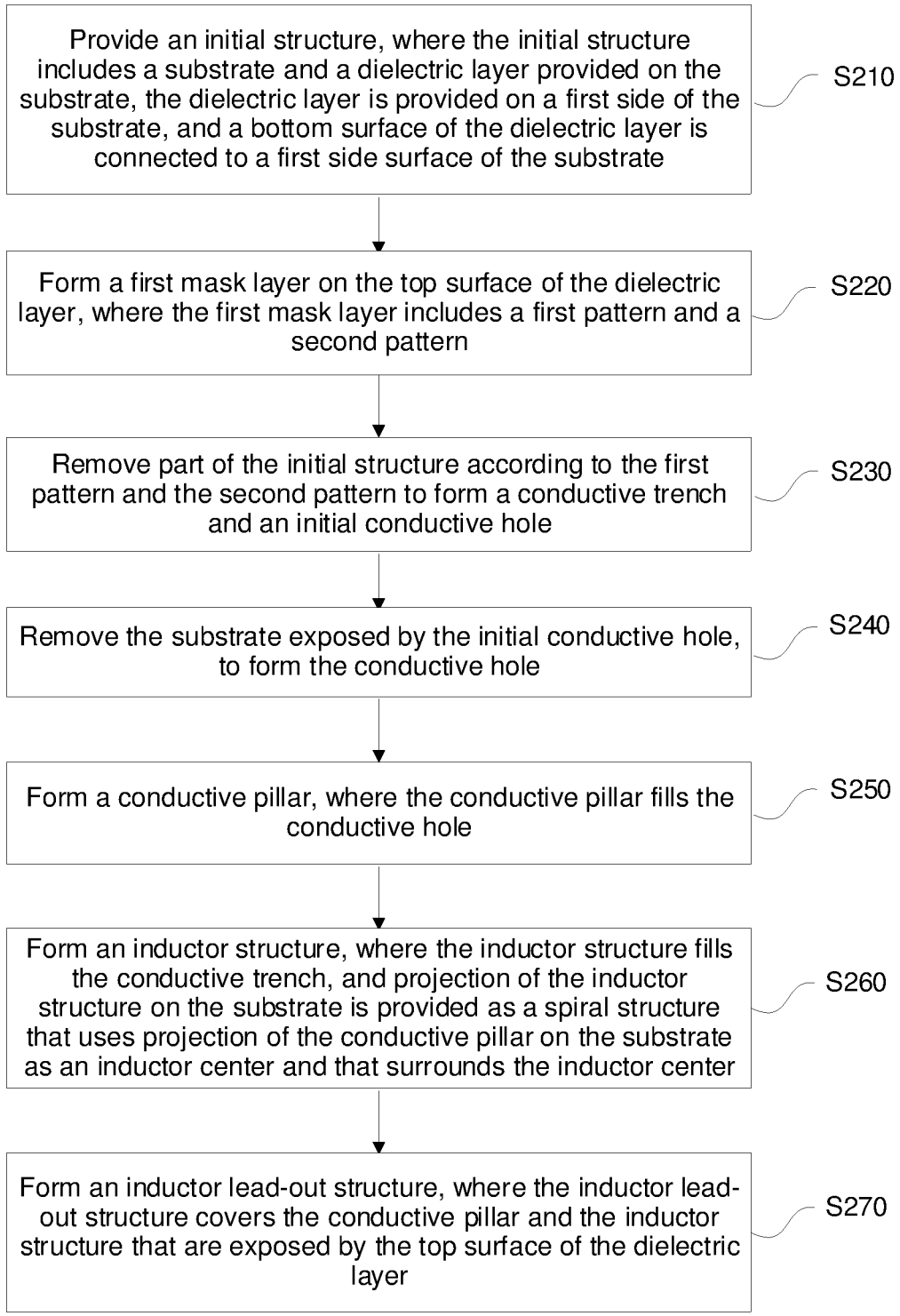
FIG. 2 is a flowchart of a method of forming a semiconductor structure according to an exemplary embodiment.

An exemplary embodiment of the present disclosure provides a method of forming a semiconductor structure, as shown in FIG. 2. FIG. 2 is a flowchart of a method of forming a semiconductor structure according to an exemplary embodiment of the present disclosure.

As shown in FIG. 2, an exemplary embodiment of the present disclosure provides a method of forming a semiconductor structure, including the following steps:

Step S210: Provide an initial structure, where the initial structure includes a substrate and a dielectric layer provided on the substrate, the dielectric layer is provided on a first side surface of the substrate, and a bottom surface of the dielectric layer is connected to the first side surface of the substrate.

Step S220: Form a first mask layer on the top surface of the dielectric layer, where the first mask layer includes a first pattern and a second pattern.

Figure 6:
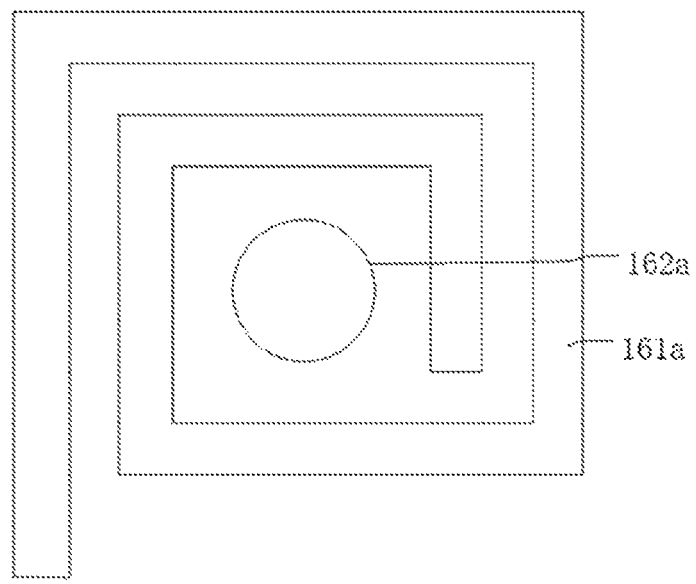
FIG. 6 is a schematic diagram of projection, of a first pattern and a second pattern that are formed, on a substrate in a method of forming a semiconductor structure according to an exemplary embodiment.

As shown in FIG. 5, a first mask layer 160 includes both a first pattern 161a and a second pattern 162a, the first pattern 161a exposes part of a top surface of a dielectric layer 120, and the second pattern 162a exposes part of the top surface of the dielectric layer 120. As shown in FIG. 6, projection of the first pattern 161a on the substrate 110 is provided as a spiral pattern that uses projection of the second pattern 162a on the substrate 110 as a spiral center and that is provided around the spiral center. In this embodiment, the spiral pattern formed by the projection of the first pattern 161a is provided to include a plurality of annular patterns, and the plurality of annular patterns are provided outwardly in sequence around the spiral center.

Step S230: Remove part of the initial structure according to the first pattern and the second pattern to form a conductive trench and an initial conductive hole.

As shown in FIG. 7, referring to FIG. 5 and FIG. 6, the dielectric layer 120 and the substrate 110 that are exposed by the first pattern 161a and the second pattern 162a are removed by using a dry etching or wet etching process, and a conductive trench 140 and an initial conductive hole 151 are formed after the etching is performed to a predetermined depth. The conductive trench 140 is provided by using the initial conductive hole 151 as a center and surrounding the initial conductive hole 151, and distances between bottom surfaces of the conductive trench 140 and the initial conductive hole 151 and a second side surface of the substrate 110 are a first spacing L1.

Step S240: Remove the substrate exposed by the initial conductive hole, to form the conductive hole.

Figure 8:
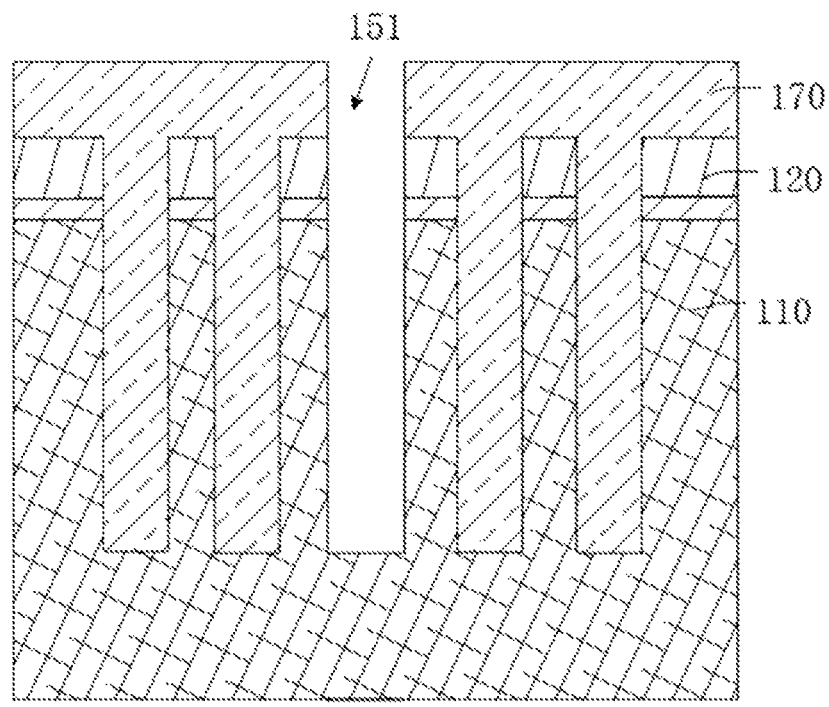
FIG. 8 is a schematic diagram of a shielding layer in a method of forming a semiconductor structure according to an exemplary embodiment.

As shown in FIG. 8, referring to FIG. 7, a shielding layer 170 is formed. The shielding layer 170 covers top surfaces of the conductive trench 140 and the dielectric layer 120. In this embodiment, a material of the shielding layer 170 is a photolithography resistant reagent. Then, the substrate 110 exposed by the initial conductive hole 151 is removed by using a photolithography process, to form a conductive hole 150 running through an initial structure 100.

Step S250: Form a conductive pillar, where the conductive pillar fills the conductive hole.

Step S260: Form an inductor structure, where the inductor structure fills the conductive trench, and projection of the inductor structure on the substrate is provided as a spiral structure that uses projection of the conductive pillar on the substrate as an inductor center and that surrounds the inductor center.

Step S270: Form an inductor lead-out structure, where the inductor lead-out structure covers the conductive pillar and the inductor structure that are exposed by the top surface of the dielectric layer.

The method of forming step S210 in this embodiment is implemented in the same manner as step S110 in the foregoing embodiment, and step S250 to step S270 are implemented in the same manner as step S140 to step S160 in the foregoing embodiment; details are not described again herein.

In the semiconductor structure formed in this embodiment, as shown in FIG. 16, referring to FIG. 17, an inductor structure 220 is provided around a conductive pillar 210, and projection of the inductor structure 220 formed on the substrate 110 is provided as a spiral structure 220a that uses projection of the conductive pillar 210 on the substrate 110 as an inductor center and that surrounds the inductor center. In this embodiment, the spiral structure 220a is a spiral annular structure surrounding the inductor center and away from the inductor center along a radial direction.

As shown in FIG. 17, the spiral structure 220a formed by the projection of the inductor structure 220 on the substrate 110 includes a starting end 2201 close to the inductor center and a termination end 2202 away from the inductor center, and the spiral structure 220a is a spiral annular structure formed by radially outwardly surrounding the inductor center and extending to the termination end 2202 from the starting end 2201. As shown in FIG. 18, referring to FIG. 19, the inductor structure 220 surrounds the conductive pillar 210 for a plurality of circles in an outer circumference of the conductive pillar 210, and the inductor structure may be connected to an external terminal by using an inductor lead-out structure 300, such that when the conductive pillar 210 is turned on, the inductor structure 220 is affected by a current conducted in the conductive pillar 210 to produce an inductance.

In this embodiment, when the semiconductor structure is to be formed, the first pattern and the second pattern are patterned on the first mask layer, the projection of the first pattern on the substrate is provided as the spiral pattern that uses the projection of the second pattern on the substrate as the spiral center and that is provided around the spiral center, only one time of patterning on the first mask layer is required, and both the first pattern and the second pattern are patterned on the top surface of the dielectric layer, such that the patterning difficulty is reduced and the patterning accuracy is high.

Figure 3:
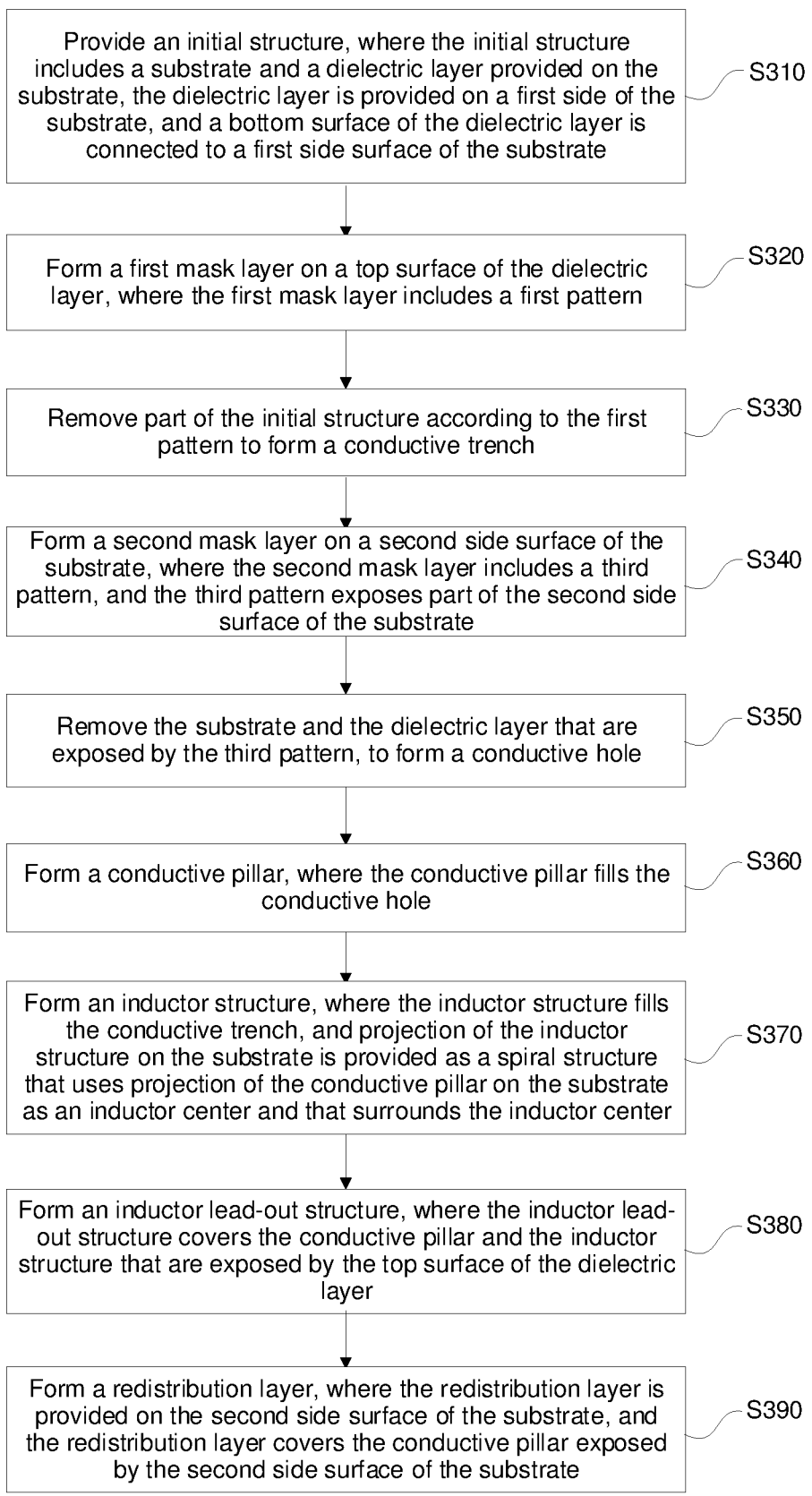
FIG. 3 is a flowchart of a method of forming a semiconductor structure according to an exemplary embodiment.

An exemplary embodiment of the present disclosure provides a method of forming a semiconductor structure, as shown in FIG. 3. FIG. 3 is a flowchart of a method of forming a semiconductor structure according to an exemplary embodiment of the present disclosure.

As shown in FIG. 3, an exemplary embodiment of the present disclosure provides a method of forming a semiconductor structure, including the following steps:

Step S310: Provide an initial structure, where the initial structure includes a substrate and a dielectric layer provided on the substrate, the dielectric layer is provided on a first side of the substrate, and a bottom surface of the dielectric layer is connected to a first side surface of the substrate.

Step S320: Form a first mask layer on a top surface of the dielectric layer, where the first mask layer includes a first pattern.

Figure 10:
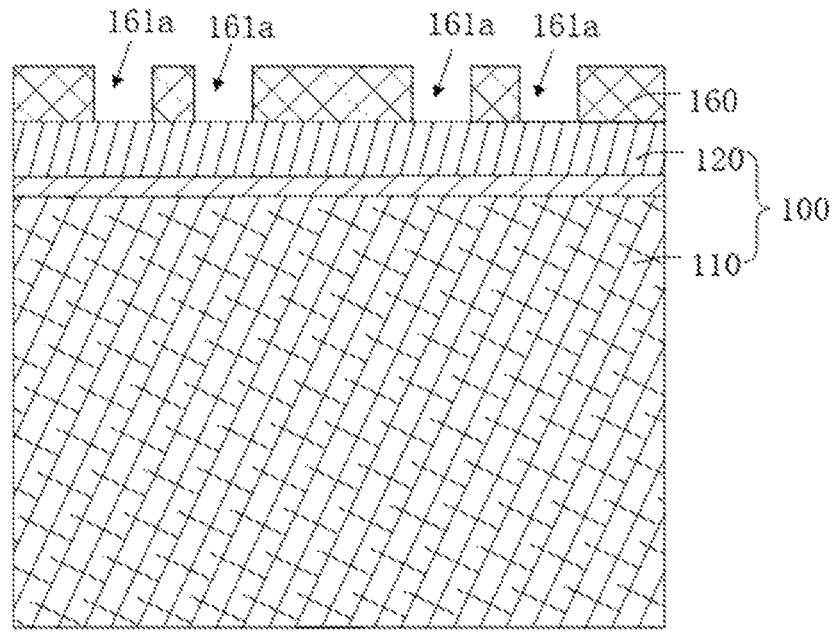
FIG. 10 is a schematic diagram of forming a first mask layer on an initial structure in a method of forming a semiconductor structure according to an exemplary embodiment.
Figure 13:
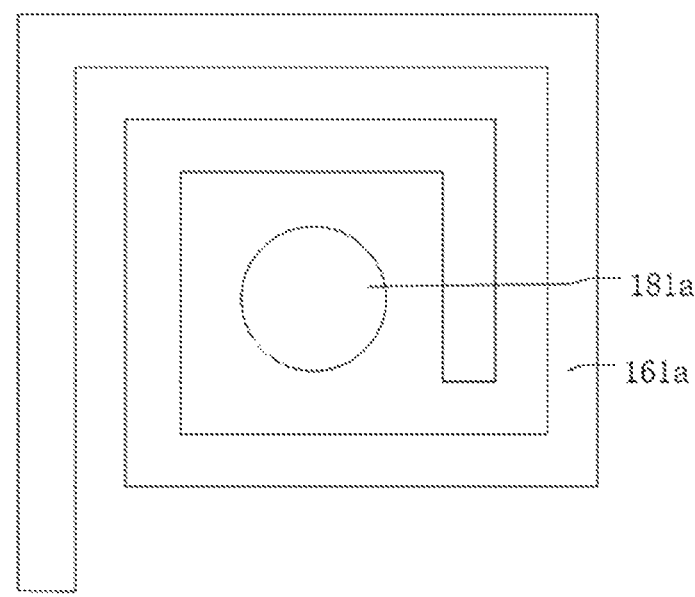
FIG. 13 is a schematic diagram of projection, of a first pattern and a third pattern that are formed, on a substrate in a method of forming a semiconductor structure according to an exemplary embodiment.

As shown in FIG. 10, a first mask layer 160 is formed on an initial structure 100. The first mask layer 160 covers a top surface of a dielectric layer 120, and the first mask layer 160 includes a first pattern 161a. Referring to FIG. 13, projection of the first pattern 161a formed on the substrate 110 is a spiral pattern.

Step S330: Remove part of the initial structure according to the first pattern to form a conductive trench.

Figure 11:
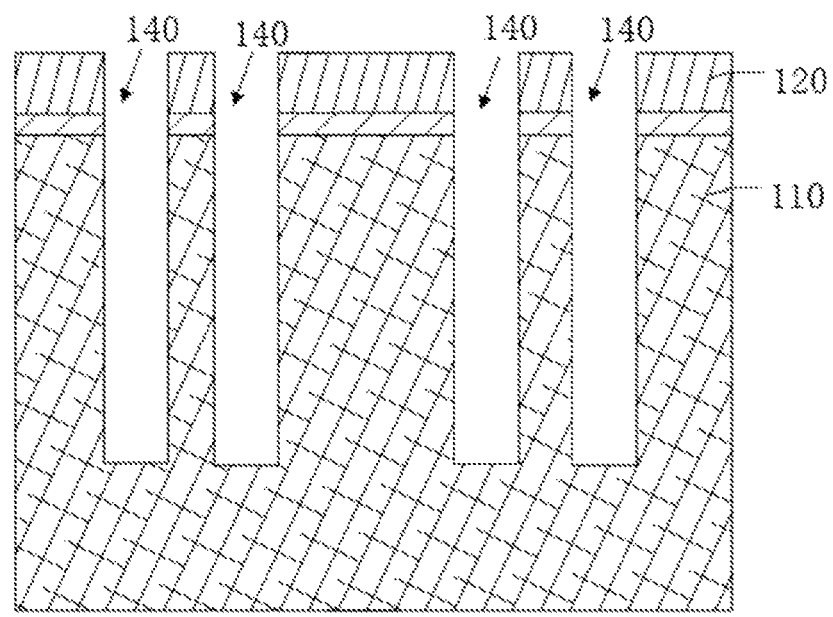
FIG. 11 is a schematic diagram of forming a conductive trench in a method of forming a semiconductor structure according to an exemplary embodiment.

As shown in FIG. 11, referring to FIG. 10, a conductive trench 140 is formed in the initial structure 100. A distance between a bottom surface of the conductive trench 140 and a second side surface of the substrate is a first spacing L1. The implementation of forming the conductive trench 140 is the same as the implementation of forming the conductive trench 140 in step S230 in the foregoing embodiment.

Step S340: Form a second mask layer on a second side surface of the substrate, where the second mask layer includes a third pattern, and the third pattern exposes part of the second side surface of the substrate.

Figure 12:
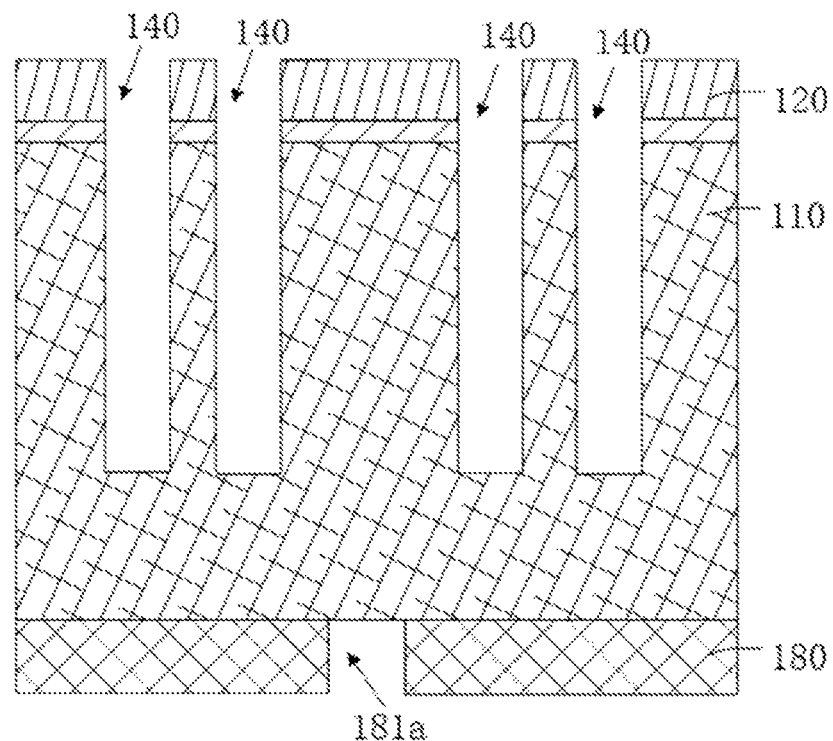
FIG. 12 is a schematic diagram of forming a second mask layer on an initial structure in a method of forming a semiconductor structure according to an exemplary embodiment.

As shown in FIG. 12, referring to FIG. 11, a second mask layer 180 is formed. The second mask layer 180 covers the second side surface of the substrate 110. The second mask layer 180 is patterned according to projection of the conductive trench 140 formed on the substrate 110, to form a third pattern 181a on the second mask layer 180. The third pattern 181a exposes part of the second side surface of the substrate 110. In this embodiment, a projection image of the conductive trench 140 formed on the substrate 110 is obtained through light, and the third pattern 181a is patterned according to the projection of the conductive trench 140 formed on the substrate 110. As shown in FIG. 13, projection of the third pattern 181a formed on the substrate 110 is provided as a spiral center of the projection of the conductive trench 140 formed on the substrate 110. As shown in FIG. 13, the spiral pattern formed by the projection of the first pattern 161a on the substrate 110 is provided to include a plurality of annular patterns, and the plurality of annular patterns are provided outwardly in sequence around the spiral center.

Step S350: Remove the substrate and the dielectric layer that are exposed by the third pattern, to form a conductive hole.

Figure 14:
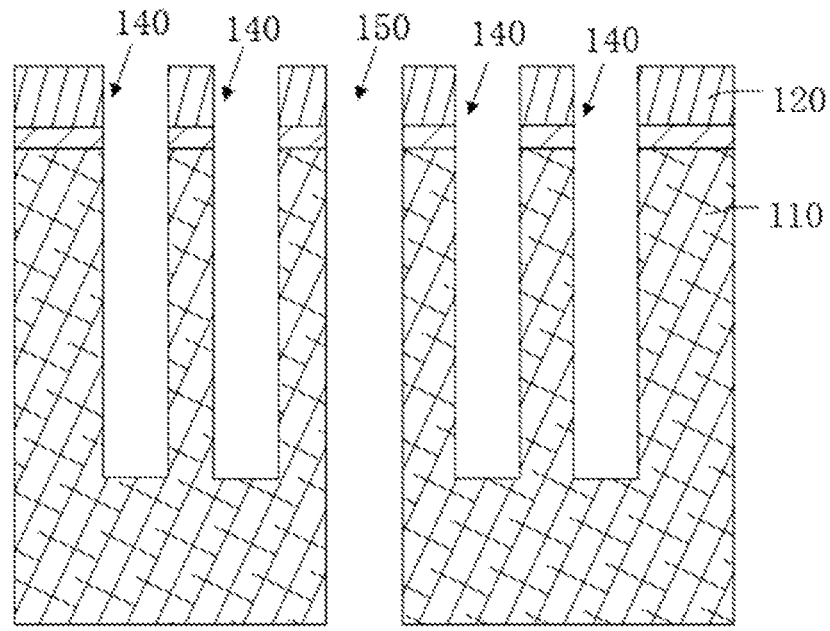
FIG. 14 is a schematic diagram of forming a conductive hole in a method of forming a semiconductor structure according to an exemplary embodiment.

As shown in FIG. 14, referring to FIG. 12 and FIG. 13, the substrate 110 exposed by the third pattern 181a is removed through etching by using a dry etching or wet etching process, to transfer the third pattern 181a onto the dielectric layer 120, and the dielectric layer 120 is etched according to the third pattern 181a, to form a conductive hole 150 running through the substrate 110. The conductive hole 150 is provided at a central position of the conductive trench 140, and the conductive trench 140 uses the conductive hole 150 as a center and spirally surrounds the conductive hole 150 along a direction away from the conductive hole 150.

Step S360: Form a conductive pillar, where the conductive pillar fills the conductive hole.

Step S370: Form an inductor structure, where the inductor structure fills the conductive trench, and projection of the inductor structure on the substrate is provided as a spiral structure that uses projection of the conductive pillar on the substrate as an inductor center and that surrounds the inductor center.

Step S380: Form an inductor lead-out structure, where the inductor lead-out structure covers the conductive pillar and the inductor structure that are exposed by the top surface of the dielectric layer.

The method of forming step S310 in this embodiment is implemented in the same manner as step S210 in the foregoing embodiment, and step S360 to step S380 are implemented in the same manner as step S250 to step S270 in the foregoing embodiment; details are not described again herein.

In this embodiment, when the semiconductor structure is formed, the first pattern is patterned on the first mask layer, the conductive trench is formed by etching the initial structure from the top surface of the dielectric layer to the bottom surface of the substrate according to the first pattern, then the second mask layer is formed on the second side surface of the substrate, the third pattern is patterned on the second mask layer according to the projection image of the conductive trench formed on the substrate, and the conductive hole is formed according to the third pattern, without forming a shielding layer for shielding the conductive trench, such that steps of forming and removing the shielding layer are reduced, and further a forming process of the semiconductor structure is simplified.

According to an exemplary embodiment of the present disclosure, this embodiment is a further description of step S380 in the foregoing embodiment.

Figure 4:
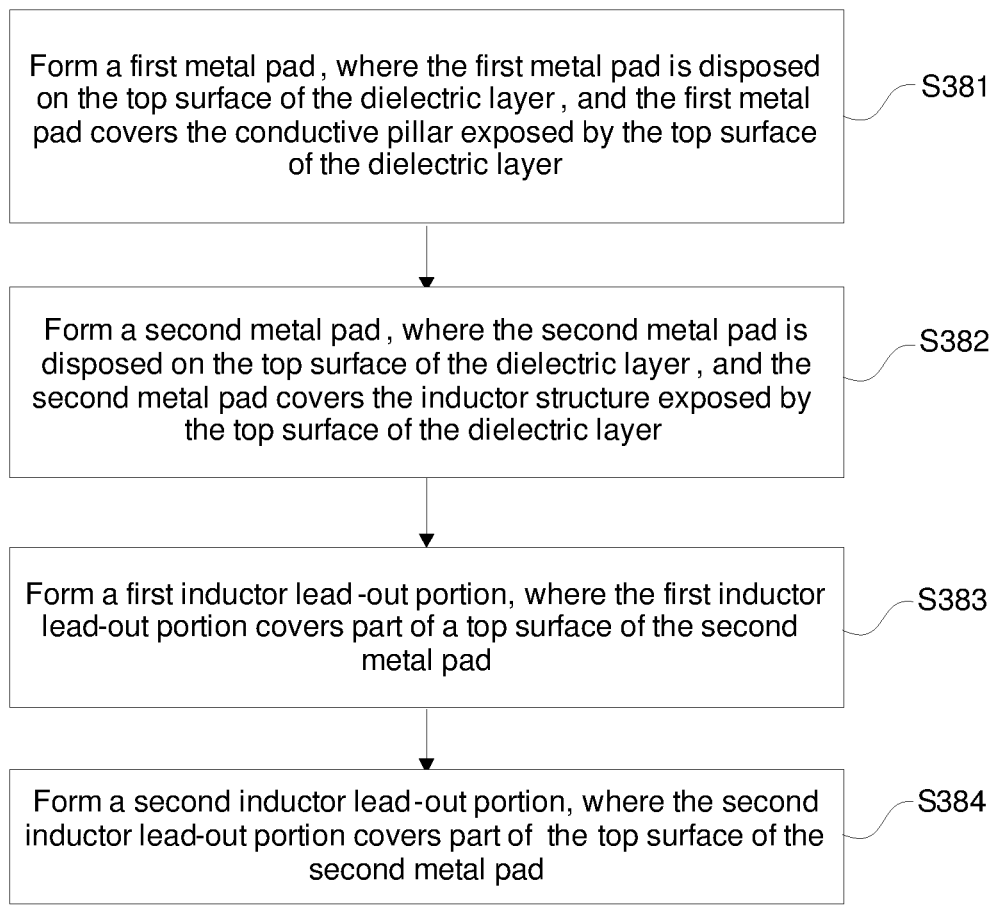
FIG. 4 is a flowchart of forming an inductor lead-out structure in a method of forming a semiconductor structure according to an exemplary embodiment.

As shown in FIG. 4, the forming an inductor lead-out structure includes:

Step S381: Form a first metal pad, where the first metal pad is disposed on the top surface of the dielectric layer, and the first metal pad covers the conductive pillar exposed by the top surface of the dielectric layer.

Step S382: Form a second metal pad, where the second metal pad is disposed on the top surface of the dielectric layer, and the second metal pad covers the inductor structure exposed by the top surface of the dielectric layer.

Step S381 and step S382 may be simultaneously performed. A dielectric material is deposited on the top surface of the dielectric layer 120 to form an auxiliary layer, and the auxiliary layer is patterned by using a light development process and a dry etching or wet etching process, to form an auxiliary pattern on the auxiliary layer. Projection of the auxiliary pattern formed on the substrate 110 coincides with projection of the conductive pillar 210 and the inductor structure 220 formed on the substrate 110. A conductive metal is deposited to fill the auxiliary pattern, so as to form the first metal pad 310 and the second metal pad 320. Then, the auxiliary layer is removed. As shown in FIG. 18, the first metal pad 310 covers the conductive pillar 210 exposed by the top surface of the dielectric layer 120, and the second metal pad 320 covers the inductor structure 220 exposed by the top surface of the dielectric layer 120. In another embodiment of the present disclosure, alternatively, the first metal pad 310 and the second metal pad 320 may be separately formed.

Step S383: Form a first inductor lead-out portion, where the first inductor lead-out portion covers part of a top surface of the second metal pad.

Step S384: Form a second inductor lead-out portion, where the second inductor lead-out portion covers part of the top surface of the second metal pad.

Step S383 and S384 may be alternatively performed. As shown in FIG. 19, a first inductor lead-out portion 331 and a second inductor lead-out portion 332 are formed on a top surface of the second metal pad 320 through immersion tin soldering. In this embodiment, referring to FIG. 17, projection of the first inductor lead-out portion 331 formed on the substrate 110 is located at a starting end 2201 of a spiral structure 220a; projection of the second inductor lead-out portion 332 formed on the substrate 110 is located at a termination end 2202 of the spiral structure 220a. In another embodiment of the present disclosure, alternatively, the first inductor lead-out portion 331 and the second inductor lead-out portion 332 may be separately formed.

In the method of forming this embodiment, the first inductor lead-out portion is provided on an end of the inductor structure closest to the conductive pillar, the second inductor lead-out portion is provided on an end of the inductor structure farthest away from the conductive pillar, and the first inductor lead-out structure and the second inductor lead-out structure are oppositely provided. In the semiconductor structure formed in this embodiment, the first inductor lead-out portion and the second inductor lead-out portion may be connected to an external terminal, to form a complete inductor device.

According to an exemplary embodiment of the present disclosure, most of content of this embodiment is the same as that of the foregoing embodiment, and a difference lies in that, as shown in FIG. 3, a method of forming a semiconductor structure in this embodiment further includes:

Step S390: Form a redistribution layer, where the redistribution layer is provided on the second side surface of the substrate, and the redistribution layer covers the conductive pillar exposed by the second side surface of the substrate.

Figure 20:
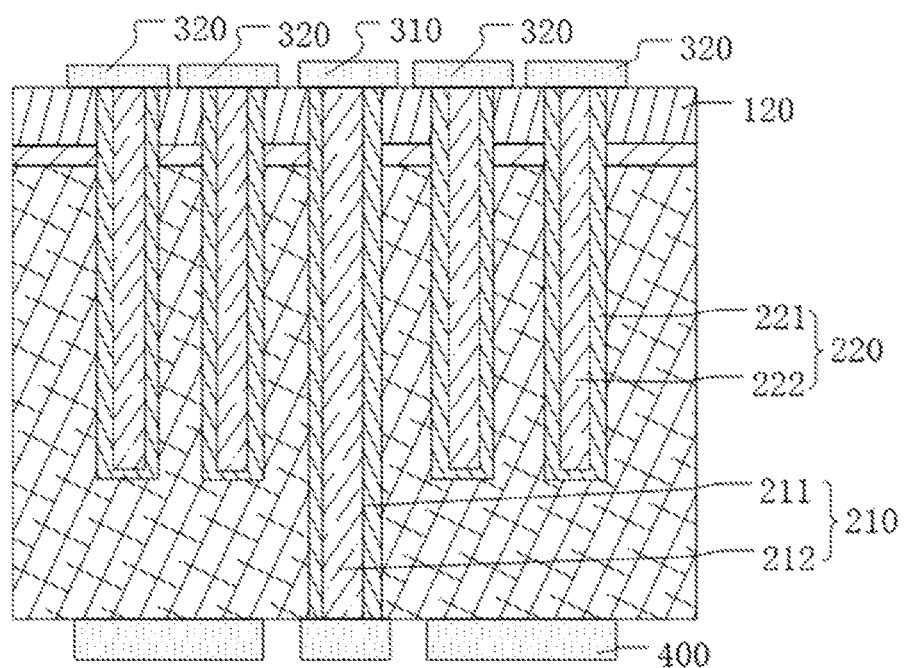
FIG. 20 is a schematic diagram of forming a redistribution layer in a method of forming a semiconductor structure according to an exemplary embodiment.

In this embodiment, forming a redistribution layer 400 includes: forming an insulating layer on the second side surface of the substrate 110, patterning the insulating layer by using an exposure process, a development process, and a dry etching or wet etching process, forming a redistribution pattern on the insulating layer, where the redistribution pattern exposes part of the second side surface of the substrate 110, and forming the redistribution layer 400 according to the redistribution pattern. As shown in FIG. 20, the redistribution layer 400 covers the conductive pillar 210 exposed by the second side surface of the substrate 110.

In this embodiment, the redistribution layer electrically connected to the conductive pillar is formed on the second side surface of the substrate of the semiconductor structure, and an interconnection contact position of the semiconductor structure is changed by using the redistribution layer, such that the semiconductor structure can be adapt to different packaging forms.

An exemplary embodiment of the present disclosure provides a semiconductor structure. As shown in FIG. 20, referring to FIG. 14, the semiconductor structure includes: a substrate 110, a dielectric layer 120 connected to the substrate 110, and a conductive trench 140 and a conductive hole 150 that are provided on the dielectric layer 120 and the substrate 110. The substrate 110 includes a first side and a second side, the dielectric layer 120 is provided on the first side of the substrate 110, and a bottom surface of the dielectric layer 120 is connected to a first side surface of the substrate 110. The conductive trench 140 extends to a second side surface of the substrate 110 from the top surface of the dielectric layer 120, the conductive trench 140 exposes part of the dielectric layer 120 and part of the substrate 110, and a distance between a bottom surface of the conductive trench 140 and the second side surface of the substrate 110 is a first spacing L1. The conductive hole 150 extends to the second side surface of the substrate 110 from the top surface of the dielectric layer 120. The semiconductor structure further includes a conductive pillar 210 filling the conductive hole 150, an inductor structure 220 filling the conductive trench 140, and an inductor lead-out structure 300 covering the conductive pillar 210 and the inductor structure 220 that are exposed by the top surface of the dielectric layer 120. As shown in FIG. 17, projection of the inductor structure 220 on the substrate 110 is provided as a spiral structure 220a that uses projection of the conductive pillar 210 on the substrate 110 as an inductor center and that surrounds the inductor center.

In the semiconductor structure in this embodiment, the inductor structure 220 spirally wound around the conductive pillar 210 is disposed around the conductive pillar 210, and the inductor lead-out structure 300 connected to the inductor structure 220 is further disposed on the top surface of the dielectric layer 120, such that the conductive pillar 210, the inductor structure 220, and the inductor lead-out structure 300 together form an inductor device with the conductive pillar 210 as a magnetic core and the inductor structure 220 as a winding coil around the conductive pillar 210.

The conductive pillar 210 of the semiconductor structure in this embodiment is not only used as an TSV structure used for interconnection, but also used as the magnetic core of the inductor device, such that when the conductive pillar 210 is electrically connected to another interconnection structure, and a current passes through the conductive pillar 210, the inductor structure 220 induces the current in the conductive pillar 210 to produce an inductance. The semiconductor structure in this embodiment does not need to be provided with an inductance through IPD. This can further reduce the size of the semiconductor structure.

According to an exemplary embodiment of the present disclosure, most of content of this embodiment is the same as that of the foregoing embodiment, and a difference lies in that, as shown in FIG. 17, the spiral structure 220a includes a plurality of spiral portions 2200a sequentially connected along a clockwise direction or a counterclockwise direction, and spacings between the plurality of spiral portions 2200a and the inductor center gradually increase according to a connection sequence.

The spiral structure 220a is an annular structure that surrounds the inductor center in a predetermined shape along the clockwise direction or the counterclockwise direction. The spiral structure 220a may rectangularly or circularly surround the inductor center along the clockwise direction or the counterclockwise direction. In this embodiment, the spiral structure 220a is an annular structure rectangularly surrounding the inductor center along the counterclockwise direction. The inductor structure 220 includes a multi-circle structure surrounding an outer circumference of the conductive pillar 210, and when a current passes through the conductive pillar 210, each circle of the inductor structure 220 surrounding the conductive pillar 210 is equivalent to one circle of coils surrounding the conductive pillar 210. The inductor structure 220 and the conductive pillar 210 form an inductor device with the conductive pillar 210 as a magnetic core and the inductor structure 220 as an inductor coil around the magnetic core, and the inductor structure 220 is affected by an induced current of the magnetic core to produce an inductance.

According to an exemplary embodiment of the present disclosure, most of content of this embodiment is the same as that of the foregoing embodiment, and a difference lies in that, as shown in FIG. 17, the spiral structure 220a includes a starting end 2201 close to the inductor center and a termination end 2202 away from the inductor center, and the spiral structure 220a is provided to radially outwardly surround the inductor center and extend to the termination end from the starting end 2201.

In this embodiment, a spacing between the starting end 2201 of the spiral structure 220a and the inductor center is a first distance L2; spacings between the plurality of spiral portions 2200a and the inductor center are increased by the first distance L2 in a stepped manner according to the connection sequence.

In this embodiment, the first distance L2 is 0.2 μm to 1 μm. The first distance L2 may be 0.3 μm, 0.4 μm, 0.5 μm, 0.6 μm, 0.7 μm, 0.8 μm, or 0.9 μm.

In this embodiment, a spacing between coils of the inductor structure 220 and a minimum distance between the inductor structure 220 and the conductive pillar 210 are provided to be 0.2 μm to 1 μm, which is less than a spacing in a current rule of designing a TSV structure, such that when the conductive pillar 210 is turned on, the inductor structure 220 is affected by a current of the conductive pillar 210 to produce a greater inductance.

According to an exemplary embodiment of the present disclosure, most of content of this embodiment is the same as that of the foregoing embodiment, and a difference lies in that, as shown in FIG. 20, referring to FIG. 18 and FIG. 19, the inductor lead-out structure 300 includes: a first metal pad 310 and a second metal pad 320 that are disposed on the top surface of the dielectric layer 120, and the first inductor lead-out portion 331 and the second inductor lead-out portion 332 that are disposed on the second metal pad 320. The first metal pad 310 covers the conductive pillar 210 exposed by the top surface of the dielectric layer 120, and the second metal pad 320 covers the inductor structure 220 exposed by the top surface of the dielectric layer 120.

In this embodiment, projection of the first inductor lead-out portion 331 formed on the substrate 110 is located in a range of projection of the starting end 2201 of the spiral structure 220a formed on the substrate 110; projection of the second inductor lead-out portion 332 formed on the substrate is located in a range of projection of the termination end of the spiral structure 220a formed on the substrate 110.

In the semiconductor structure provided in the present disclosure, the inductor structure 220 that uses the conductive pillar 210 as a magnetic core and that is provided spirally around an outer circumference of the conductive pillar is used, such that when the conductive pillar 210 is turned on, the inductor structure 220 induces a current in the conductive pillar 210 to produce an inductance, and the semiconductor structure in this embodiment does not need to be provided with an inductance through IPD. This can further reduce the size of the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the present disclosure, the inductor structure surrounding the conductive pillar is formed, such that when a current passes through the conductive pillar, the inductor structure is induced by the current in the conductive pillar to produce an inductance, without integrating passive devices in the semiconductor structure. This can further reduce the size of the semiconductor structure.

The invention claimed is:

1. A method of forming a semiconductor structure, wherein the method of forming the semiconductor structure comprises:
   providing an initial structure, wherein the initial structure comprises a substrate and a dielectric layer provided on the substrate, the dielectric layer is provided on a first side of the substrate, and a bottom surface of the dielectric layer is connected to a first side surface of the substrate;
   forming a conductive trench, wherein the conductive trench extends to a second side surface of the substrate from a top surface of the dielectric layer, the conductive trench exposes part of the dielectric layer and part of the substrate, and a distance between a bottom surface of the conductive trench and the second side surface of the substrate is a first spacing;
   forming a conductive hole, wherein the conductive hole extends to the second side surface of the substrate from the top surface of the dielectric layer;
   forming a conductive pillar, wherein the conductive pillar fills the conductive hole;
   forming an inductor structure, wherein the inductor structure fills the conductive trench, and projection of the inductor structure on the substrate is provided as a spiral structure that uses projection of the conductive pillar on the substrate as an inductor center and that surrounds the inductor center; and
   forming an inductor lead-out structure, wherein the inductor lead-out structure covers the conductive pillar and the inductor structure that are exposed by the top surface of the dielectric layer.

2. The method of forming the semiconductor structure according to claim 1, wherein the forming a conductive trench comprises:
   forming a first mask layer on the top surface of the dielectric layer, wherein the first mask layer comprises a first pattern, and the first pattern exposes part of the top surface of the dielectric layer; and
   removing the dielectric layer and part of the substrate that are exposed by the first pattern, to form the conductive trench.

3. The method of forming the semiconductor structure according to claim 2, wherein the forming a conductive hole comprises:
   the first mask layer further comprising a second pattern, the second pattern exposing part of the top surface of the dielectric layer, and projection of the first pattern on the substrate being provided as a spiral pattern that uses projection of the second pattern on the substrate as a spiral center and that is provided around the spiral center;
   removing the dielectric layer and part of the substrate that are exposed by the second pattern, to form an initial conductive hole; and
   removing part of the substrate according to the initial conductive hole to form the conductive hole.

4. The method of forming the semiconductor structure according to claim 3, wherein the removing part of the substrate according to the initial conductive hole to form the conductive hole comprises:
   forming a shielding layer, wherein the shielding layer covers the conductive trench and the top surface of the dielectric layer; and
   removing the substrate exposed by the initial conductive hole, to form the conductive hole.

5. The method of forming the semiconductor structure according to claim 2, wherein the forming a conductive hole comprises:

forming a second mask layer on the second side surface of the substrate, wherein the second mask layer comprises a third pattern, the third pattern exposes part of the second side surface of the substrate, and projection of the first pattern on the substrate is provided as a spiral pattern that uses projection of the third pattern on the substrate as a spiral center and that is provided around the spiral center; and removing the substrate and the dielectric layer that are exposed by the third pattern, to form the conductive hole.

6. The method of forming the semiconductor structure according to claim 4, wherein the spiral pattern is provided to comprise a plurality of annular patterns, and the plurality of annular patterns are provided outwardly in sequence around the spiral center.

7. The method of forming the semiconductor structure according to claim 1, wherein the spiral structure comprises a starting end close to the inductor center and a termination end away from the inductor center, and the spiral structure is an annular structure formed by radially outwardly surrounding the inductor center and extending to the termination end from the starting end.

8. The method of forming the semiconductor structure according to claim 7, wherein the forming an inductor lead-out structure comprises:

forming a first metal pad, wherein the first metal pad is disposed on the top surface of the dielectric layer, and the first metal pad covers the conductive pillar exposed by the top surface of the dielectric layer;

forming a second metal pad, wherein the second metal pad is disposed on the top surface of the dielectric layer, and the second metal pad covers the inductor structure exposed by the top surface of the dielectric layer;

forming a first inductor lead-out portion, wherein the first inductor lead-out portion covers part of a top surface of the second metal pad; and forming a second inductor lead-out portion, wherein the second inductor lead-out portion covers part of the top surface of the second metal pad.

9. The method of forming the semiconductor structure according to claim 8, wherein projection of the first inductor lead-out portion formed on the substrate is located at the starting end of the spiral structure; and projection of the second inductor lead-out portion formed on the substrate is located at the termination end of the spiral structure.

10. The method of forming the semiconductor structure according to claim 5, wherein the spiral pattern is provided to comprise a plurality of annular patterns, and the plurality of annular patterns are provided outwardly in sequence around the spiral center.

11. A semiconductor structure, wherein the semiconductor structure comprises:

a substrate, wherein the substrate comprises a first side and a second side;

a dielectric layer, wherein the dielectric layer is provided on the first side of the substrate, and a bottom surface of the dielectric layer is connected to a first side surface of the substrate;

a conductive trench, wherein the conductive trench extends to a second side surface of the substrate from a top surface of the dielectric layer, the conductive trench exposes part of the dielectric layer and part of the substrate, and a distance between a bottom surface of the conductive trench and the second side surface of the substrate is a first spacing;

a conductive hole, wherein the conductive hole extends to the second side surface of the substrate from the top surface of the dielectric layer;

a conductive pillar, wherein the conductive pillar fills the conductive hole;

an inductor structure, wherein the inductor structure fills the conductive trench, and projection of the inductor structure on the substrate is provided as a spiral structure that uses projection of the conductive pillar on the substrate as an inductor center and that surrounds the inductor center; and an inductor lead-out structure, wherein the inductor lead-out structure covers the conductive pillar and the inductor structure that are exposed by the top surface of the dielectric layer.

12. The semiconductor structure according to claim 11, wherein the spiral structure comprises a plurality of spiral portions sequentially connected along a clockwise direction or a counterclockwise direction, and spacings between the plurality of spiral portions and the inductor center gradually increase according to a connection sequence.

13. The semiconductor structure according to claim 12, wherein the spiral structure comprises a starting end close to the inductor center and a termination end away from the inductor center, and the spiral structure radially outwardly surrounds the inductor center and extends to the termination end from the starting end.

14. The semiconductor structure according to claim 13, wherein a spacing between the starting end of the spiral structure and the inductor center is a first distance; and the spacings between the plurality of spiral portions and the inductor center are increased by the first distance in a stepped manner according to the connection sequence.

15. The semiconductor structure according to claim 13, wherein the inductor lead-out structure comprises:

a first metal pad, wherein the first metal pad is disposed on the top surface of the dielectric layer, and the first metal pad covers the conductive pillar exposed by the top surface of the dielectric layer;

a second metal pad, wherein the second metal pad is disposed on the top surface of the dielectric layer, and the second metal pad covers the inductor structure exposed by the top surface of the dielectric layer;

a first inductor lead-out portion, wherein the first inductor lead-out portion is disposed on the second metal pad; and a second inductor lead-out portion, wherein the second inductor lead-out portion is disposed on the second metal pad.

16. The semiconductor structure according to claim 15, wherein projection of the first inductor lead-out portion formed on the substrate is located at the starting end of the spiral structure; and projection of the second inductor lead-out portion formed on the substrate is located at the termination end of the spiral structure.

* * * * *